US008559234B2

(12) United States Patent
Kumazaki et al.

(10) Patent No.: US 8,559,234 B2
(45) Date of Patent: Oct. 15, 2013

(54) SEMICONDUCTOR MEMORY DEVICE

(75) Inventors: Noriyasu Kumazaki, Kawasaki (JP);
Susumu Fujimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 13/343,972

(22) Filed: Jan. 5, 2012

(65) Prior Publication Data
US 2012/0170380 A1  Jul. 5, 2012

(30) Foreign Application Priority Data
Jan. 5, 2011 (JP) .................. 2011-000661

(51) Int. Cl.
G11C 16/06 (2006.01)
(52) U.S. Cl.
USPC ............. 365/185.25; 365/185.18; 365/226; 365/189.05; 365/189.09
(58) Field of Classification Search
USPC ........ 365/185.25, 185.18, 226, 189.05, 18.09
See application file for complete search history.

(56) References Cited

U.S. PATENT DOCUMENTS

| 6,297,992 B1 * | 10/2001 | Oh ........................... 365/185.25 |
| 2002/0140402 A1 | 10/2002 | Sudo |
| 2002/0140802 A1 | 10/2002 | Yamada |

FOREIGN PATENT DOCUMENTS

| JP | 10-241383 | 9/1998 |
| JP | 2002-296306 | 10/2002 |
| WO | WO 98/31016 A1 | 7/1998 |
| WO | WO 2006/036443 A2 | 4/2006 |
| WO | WO 2009/020845 A1 | 2/2009 |

OTHER PUBLICATIONS

Office Action issued May 8, 2012, in Japanese patent Application No. 2011-000661 (with English-language Translation).

* cited by examiner

*Primary Examiner* — David Lam
(74) *Attorney, Agent, or Firm* — Oblon, Spivak, McClelland, Maier & Neustadt, L.L.P.

(57) ABSTRACT

According to one embodiment, a semiconductor memory device includes a memory cell array, a first detecting circuit, a second detecting circuit, a switching circuit and a recovery control circuit. The first detecting circuit outputs a first detection signal which shows whether an externally supplied external power supply is equal to or more than a first voltage. The second detecting circuit outputs, at a higher speed than the first detecting circuit, a second detection signal which shows whether the external power supply is equal to or more than the first voltage. In a write operation, the switching circuit outputs the second detection signal output from the second detecting circuit. In an operation other than the write operation, the switching circuit outputs the first detection signal output from the first detecting circuit. The recovery control circuit terminates the write operation according to the second detection signal output from the switching circuit.

15 Claims, 11 Drawing Sheets

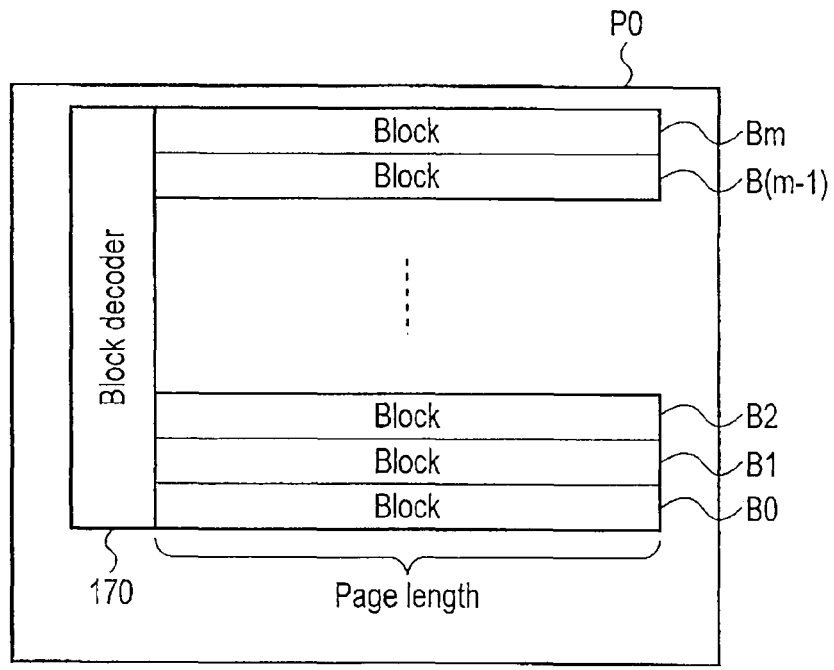
F I G. 2
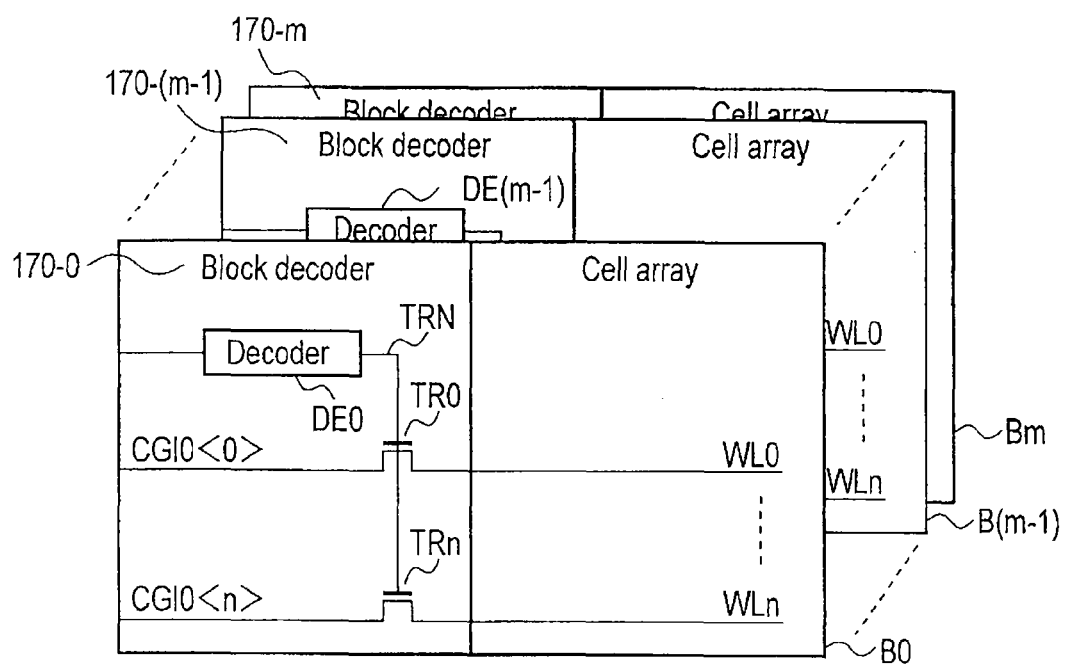
F I G. 3

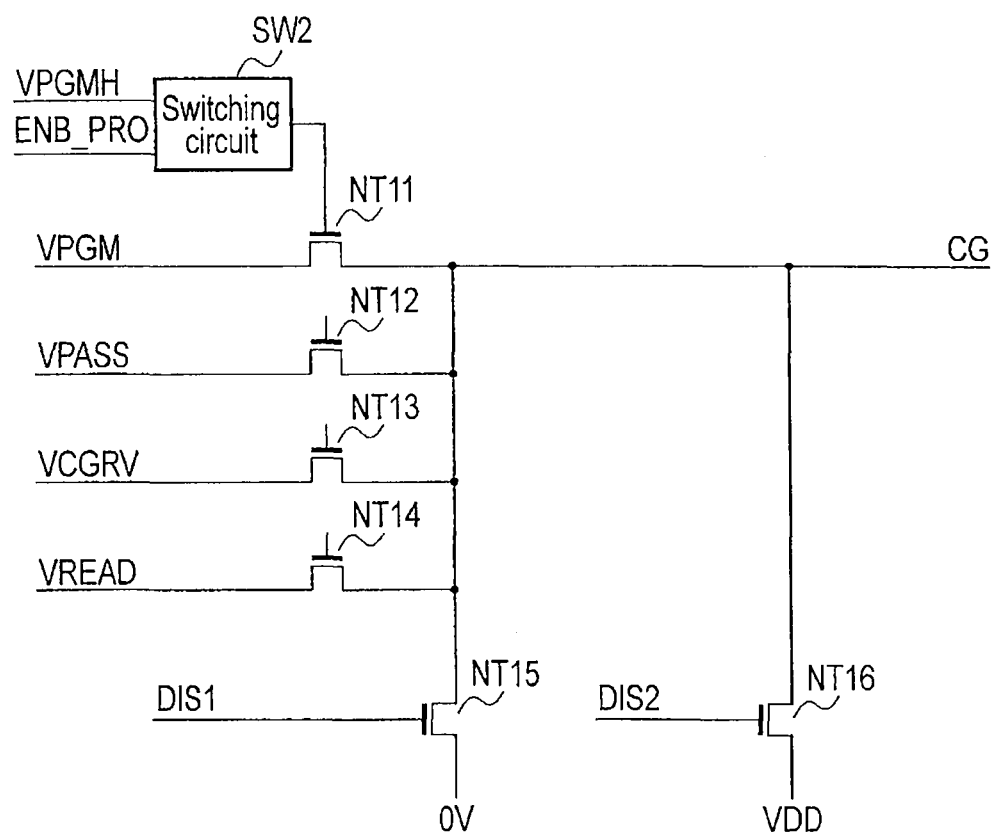
F I G. 8

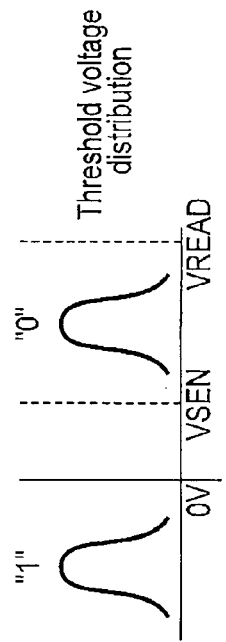
F I G. 10A
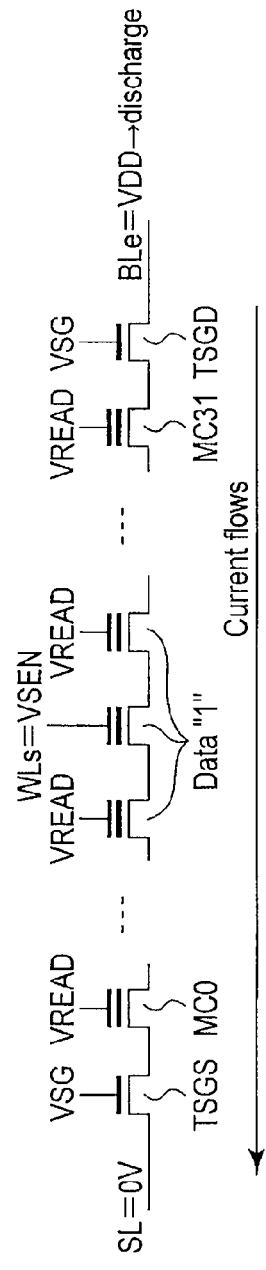
F I G. 10B
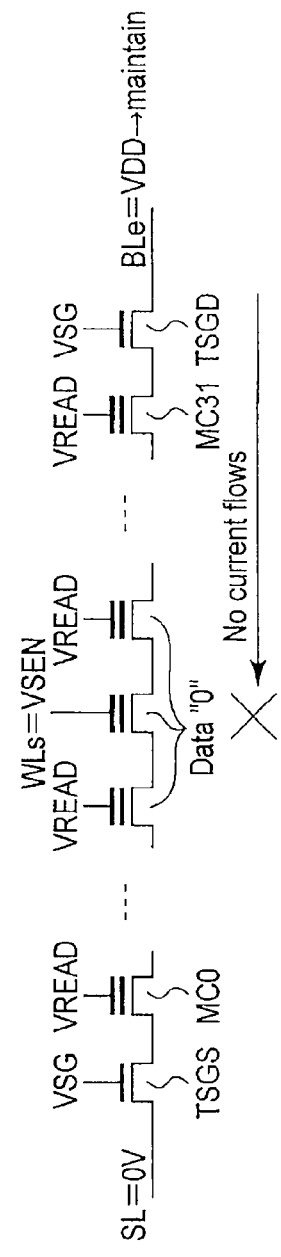
F I G. 10C
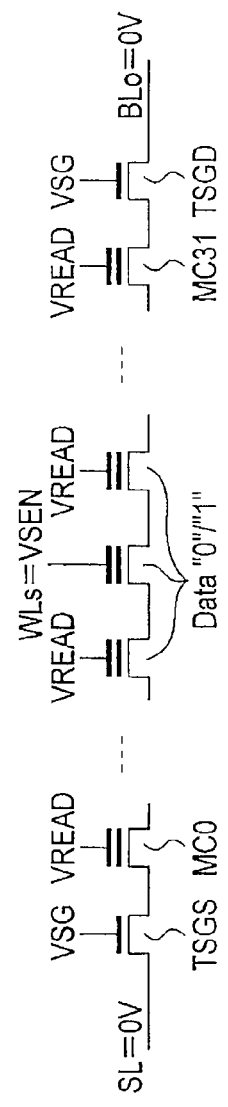
F I G. 10D

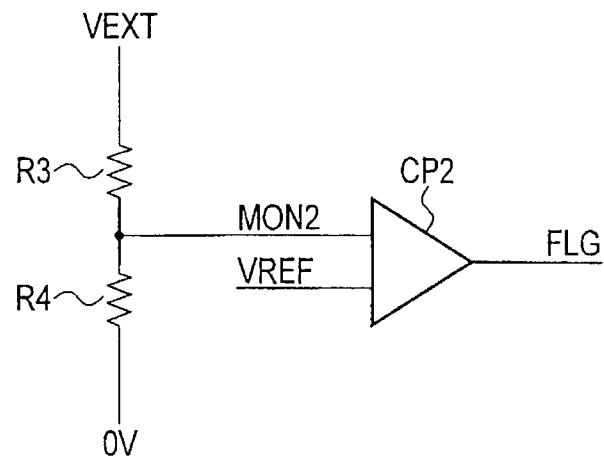
F I G. 11
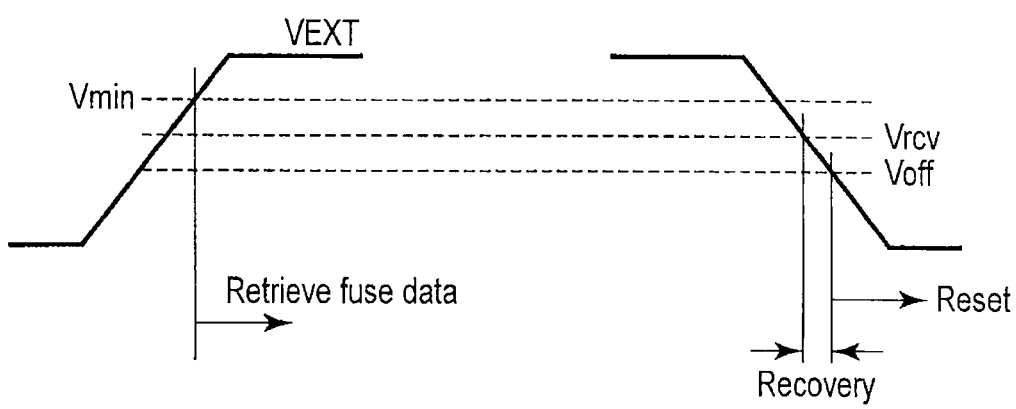
F I G. 12

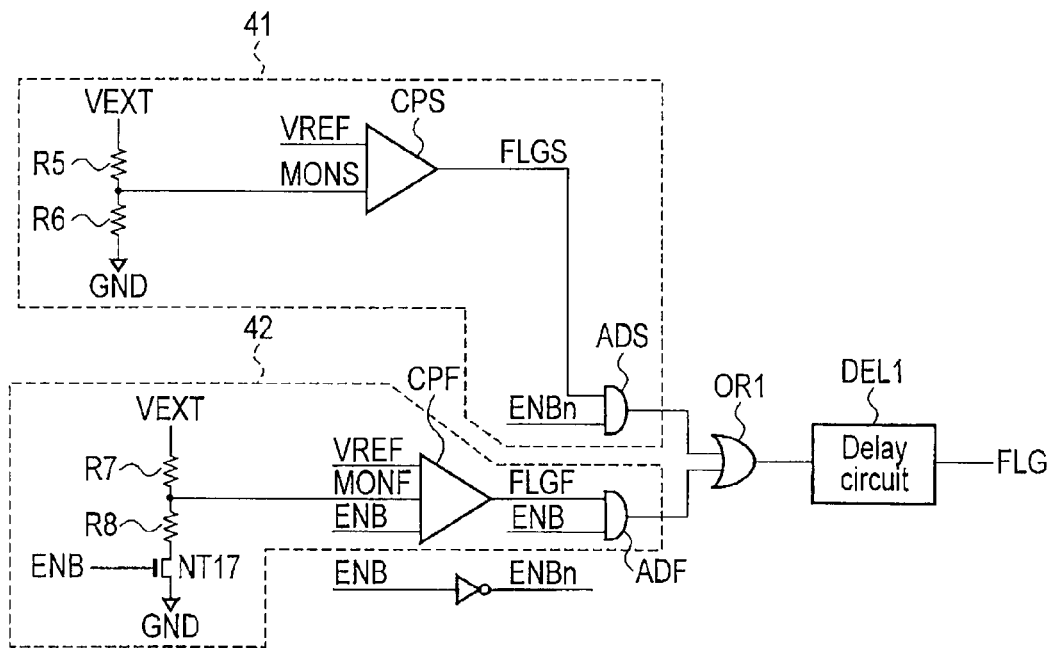
F I G. 13
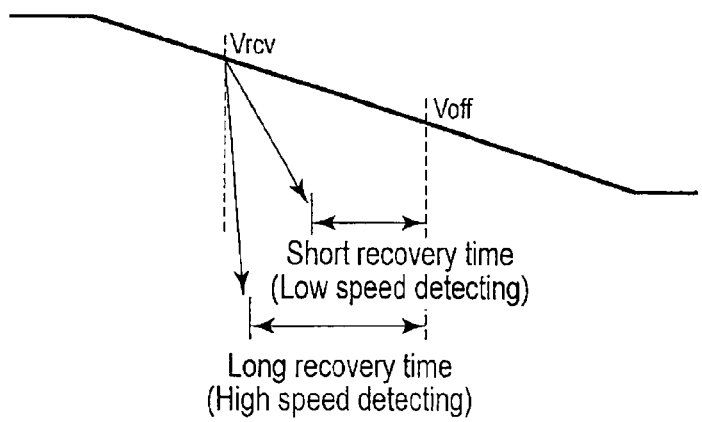
F I G. 14

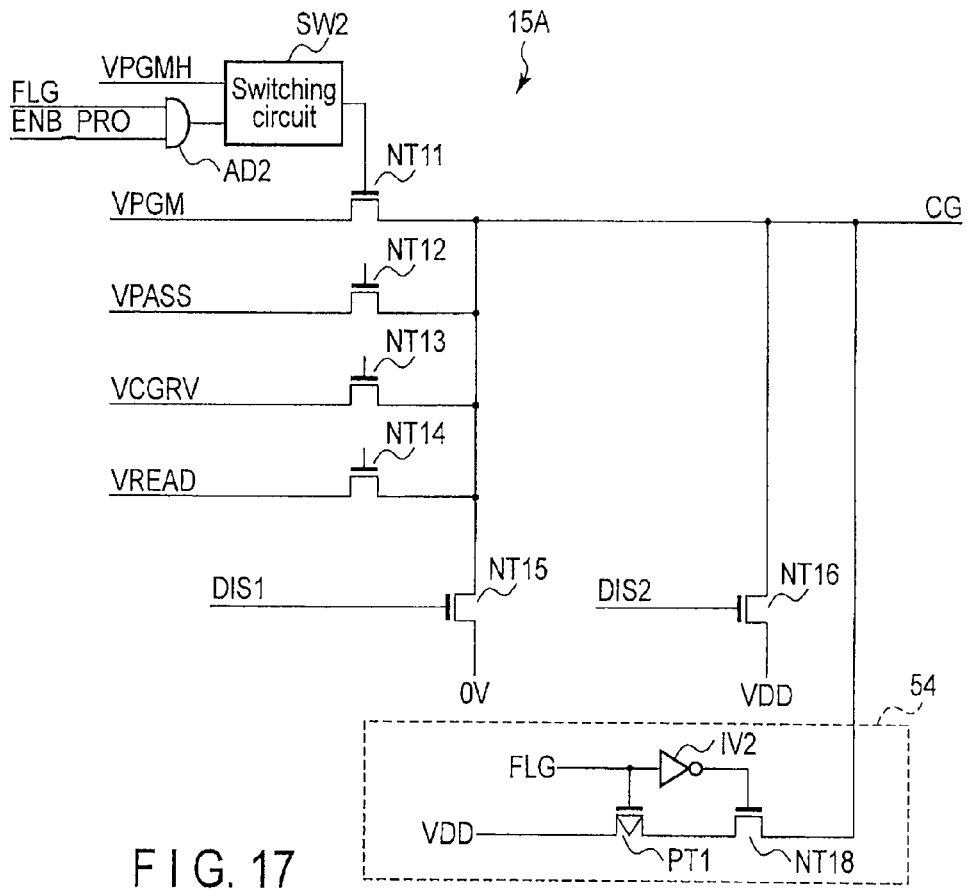
F I G. 17
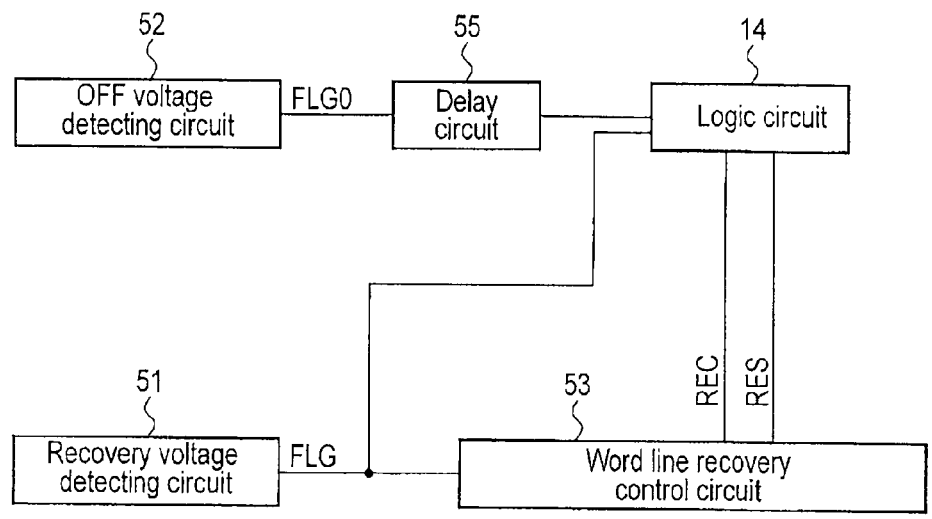
F I G. 18

SEMICONDUCTOR MEMORY DEVICE

CROSS-REFERENCE TO RELATED APPLICATIONS

This application is based upon and claims the benefit of priority from prior Japanese Patent Application No. 2011-000661, filed Jan. 5, 2011, the entire contents of which are incorporated herein by reference.

FIELD

Embodiments described herein relate generally to a semiconductor memory device, e.g., NAND flash memory.

BACKGROUND

In recent years, as mobile devices such as mobile phones become widely available, memories used for such devices are required to achieve low voltage operation. In these mobile devices, NAND flash memory is widely used as memory, and it is extremely important for the NAND flash memory to increase the margin in low voltage operation.

BRIEF DESCRIPTION OF THE DRAWINGS

FIGS. 2 and 3 are figures illustrating a configuration of a plane of the first embodiment;

FIG. 8 is a circuit diagram illustrating a configuration of a CG driver of the first embodiment;

FIGS. 10A, 10B, 10C and 10D are figures illustrating program verification operation of the NAND flash memory;

FIG. 11 is a figure illustrating an example of a detecting circuit of an external power supply according to the first embodiment;

FIG. 12 is a figure illustrating an example of a detection voltage of the external power supply according to the first embodiment;

FIG. 13 is a circuit diagram illustrating a recovery voltage detecting circuit according to the first embodiment;

FIG. 14 is a figure illustrating a recovery operation time when the external power supply is shut off in the first embodiment;

FIG. 17 is a circuit diagram illustrating a CG driver according to a third embodiment; and FIG. 18 is a block diagram including a power supply detecting circuit and a word line recovery control circuit according to a fourth embodiment.

DETAILED DESCRIPTION

Figure 1:
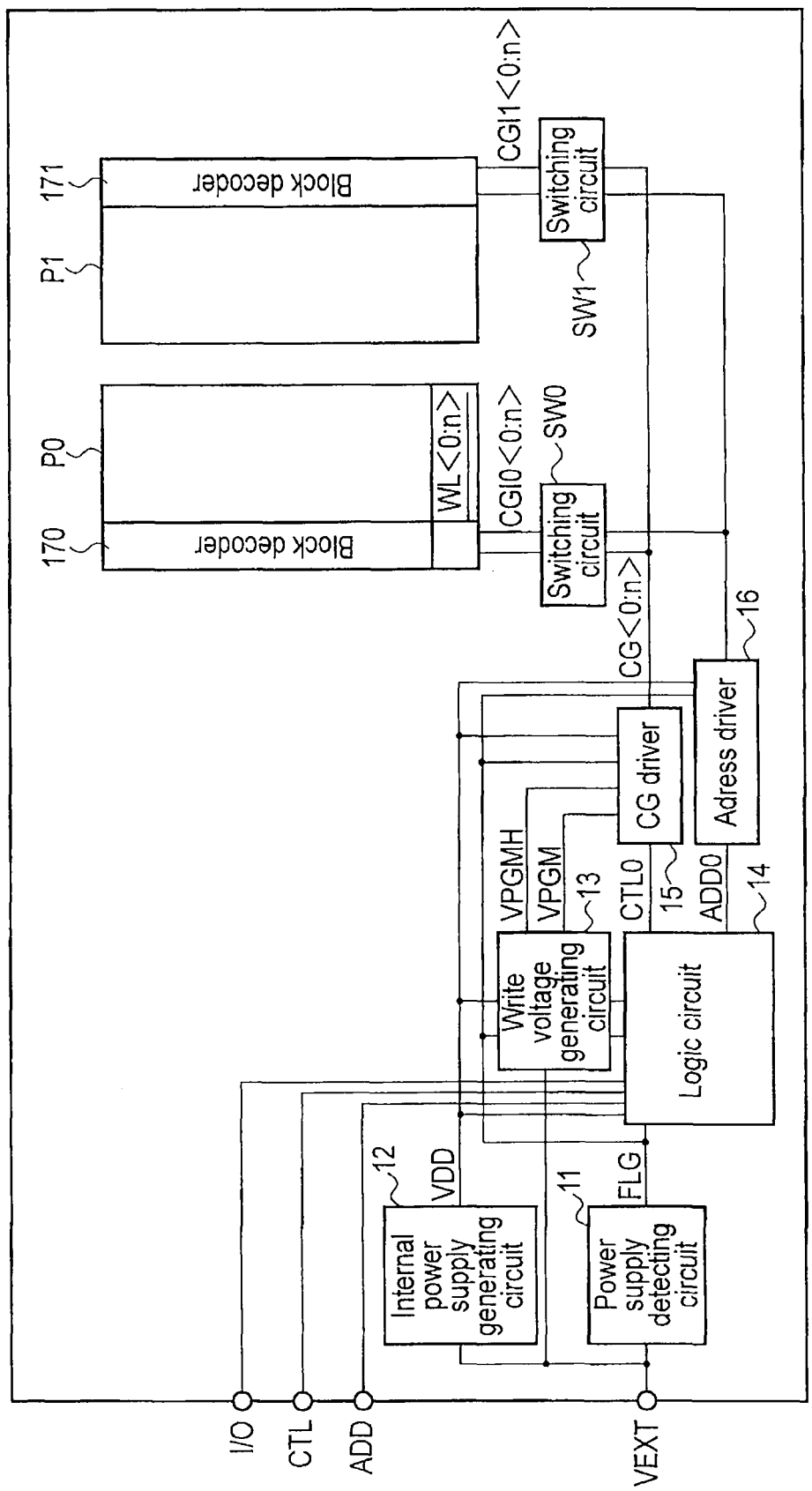
FIG. 1 is a block diagram illustrating a configuration of NAND flash memory according to a first embodiment.

A semiconductor memory device according to embodiments will be hereinafter explained with reference to the drawings. In this case, for example, NAND flash memory is explained as a semiconductor memory device. In the following description, constituent elements having substantially the same function and configuration are denoted with the same reference numerals, and repeated explanation thereabout will be made only when it is necessary.

In general, according to one embodiment, a semiconductor memory device includes a memory cell array, a first detecting circuit, a second detecting circuit, a switching circuit and a recovery control circuit. The memory cell array has memory cells each connected to a word line and a bit line. The first detecting circuit outputs a first detection signal which shows whether an externally supplied external power supply is equal to or more than a first voltage. The second detecting circuit outputs, at a higher speed than the first detecting circuit, a second detection signal which shows whether the external power supply is equal to or more than the first voltage. In a write operation that applies a write voltage to a word line connected to the memory cell, the switching circuit outputs the second detection signal that is output from the second detecting circuit. In an operation other than the write operation, the switching circuit outputs the first detection signal that is output from the first detecting circuit. The recovery control circuit terminates the write operation according to the second detection signal that is output from the switching circuit.

[First Embodiment]

NAND flash memory according to the first embodiment will be explained.

Hereinafter, a circuit configuration of NAND flash memory will be explained, and subsequently, write (program/program verification) operation (in this case, two-valued operation), i.e., one of basic operations of the NAND flash memory, will be explained, and thereafter, problems associated with shut off of power supply during program operation and solution thereto will be explained.

[1] Circuit Configuration

First, a configuration of the NAND flash memory will be explained.

FIG. 1 is a block diagram illustrating a configuration of NAND flash memory.

As shown in the figure, the NAND flash memory (hereinafter referred to as flash memory) includes a plurality of planes (Districts) P0, P1, a power supply detecting circuit 11, an internal power supply generating circuit 12, a write voltage generating circuit 13, a logical circuit 14, a control gate driver (hereinafter referred to as a CG driver) 15, an address driver 16, and switching circuits SW0, SW1.

The power supply detecting circuit 11 detects a voltage of a power supply (external power supply) VEXT externally supplied, and outputs a flag signal FLG according to the detection result to the write voltage generating circuit 13, the logical circuit 14, the CG driver 15, and the address driver 16.

The internal power supply generating circuit 12 receives the power supply VEXT, and generates an internal power supply voltage VDD from the power supply VEXT. When the program operation starts, the write voltage generating circuit 13 generates a write voltage VPGM and a voltage VPGMH. The write voltage VPGM and the voltage VPGMH are output to the CG driver 15. The write voltage VPGM is a voltage applied to a selected word line WL during the program operation. The voltage VPGMH is a voltage at which the write voltage VPGM can be completely transferred by an nMOS transistor. The voltage VPGMH is higher than the write voltage VPGM by a threshold value of the nMOS transistor.

An address signal ADD, various kinds of control signals CTL, data (I/O), and the like are input to the logical circuit 14 from the outside. The logical circuit 14 controls operation of the analog circuit and outputs of a control signal CTL0 and a block address ADD0, and the like.

The CG driver 15 selects and drives a control gate line CG<0: n> based on the control signal CTL0 provided by the logical circuit 14. The address driver 16 selects and drives a block decoder in a plane based on the block address ADD0 provided by the logical circuit 14. The switching circuits SW0, SW1 select planes P0, P1, respectively.

In the plane P0, a block decoder 170 is provided. In the plane P1, a block decoder 171 is provided. The block decoder 170 selects a block in the plane P0. The block decoder 171 selects a block in the plane P1.

FIGS. 2 and 3 are figures illustrating configurations of planes in the flash memory. In this case, the configuration of the plane P0 is shown. However, the configuration of the plane P1 is also the same.

As shown in FIG. 2, the plane P0 includes a plurality of blocks B0, B1, B2, . . . , B(m−1), Bm. It should be noted that m denotes a natural number of 1 or more. In the plurality of blocks, the plurality of block decoders 170 are provided. In other words, as shown in FIG. 3, corresponding block decoders 170-0, 170-1, . . . , 170-(m−1), 170-m are located in the blocks B0, B1, . . . , B(m−1), Bm, respectively.

The block decoders 170-0 to 170-m have decoders DE0 to DEm, respectively. Each of the block decoders 170-0 to 170-m has transfer transistors TR0 to TRn, respectively. The control gate lines CGI0 <0> to CGI0 <n> connected to the CG driver 15 are respectively connected to word lines WL0 to WLn via transfer transistors TR0 to TRn.

When a memory cell in a certain block is accessed, the block decoder selects a block corresponding to the block decoder on the basis of the block address ADD0. Then, the decoder changes a transfer node TRN connected to the gates of the transfer transistors TR0 to TRn to "H" level, thereby turning on the transfer transistors. As a result, the voltages of the control gate lines CGI0 <0> to CGI0 <n> are respectively transferred to the word lines WL0 to WLn. In this manner, the word line of the memory cell is selected.

Figure 4:
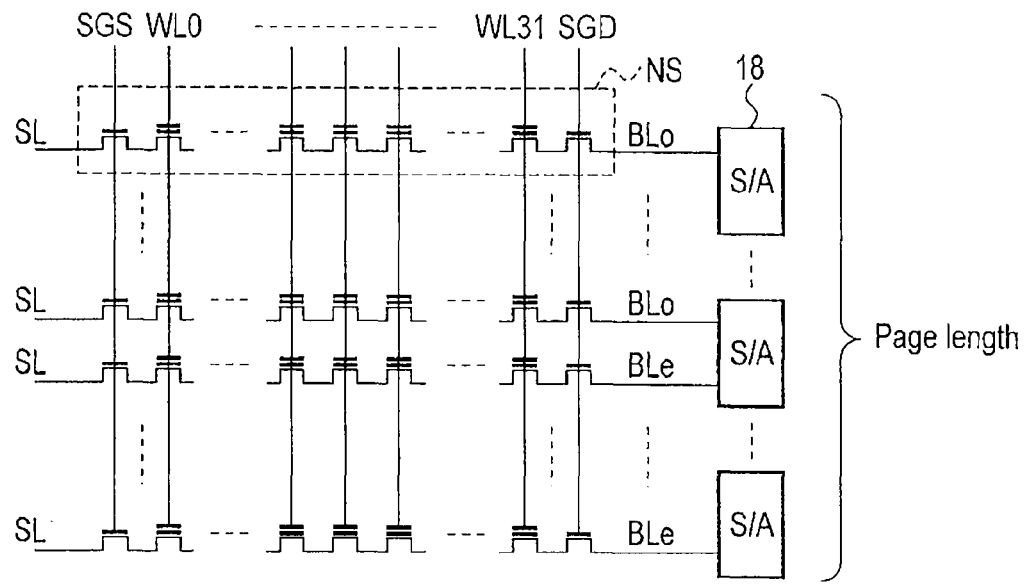
FIG. 4 is a circuit diagram illustrating a configuration of a block in a plane of the first embodiment.

FIG. 4 is a figure illustrating a configuration of a block in a plane.

As shown in the figure, the block includes NAND strings NS arranged according to the page length. One end of the NAND string NS is connected to either a bit line BLe or BLo in an alternate manner. The even-numbered bit line is denoted with BLe, and the odd-numbered bit line is denoted with BLo. The bit lines BLo, BLe are connected to sense amplifiers (S/A) 18. A pair of a bit line BLe and a bit line BLo share one sense amplifier 18. A source line SL is connected to the other end of the NAND string NS.

Figure 5:
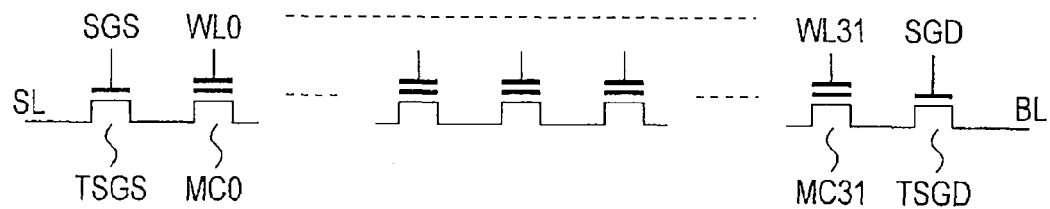
FIG. 5 is a circuit diagram illustrating a configuration of a NAND string in a block of the first embodiment.

FIG. 5 is a figure illustrating a configuration of a NAND string in a block.

As shown in the figure, the NAND string NS includes a plurality of memory cells MC0 to MC31 and selection gate transistors TSGD, TSGS. The selection gate transistors TSGD, TSGS are nMOS transistors that do not have any floating gate but have switch function. The source and the drain of each of the plurality of memory cells MC0 to MC31 are connected in series. One end of a current path of the selection gate transistor TSGD is connected to one end of the plurality of memory cells connected in series (memory cell MC31). The bit line BL (BLe or BLo) is connected to the other end of the current path of the selection gate transistor TSGD.

On the other hand, one end of the current path of the selection gate transistor TSGS is connected the other end of the memory cells connected in series (memory cell MC0). The source line SL is connected to the other end of the current path of the selection gate transistor TSGS.

As shown in FIGS. 4 and 5, the word lines WL0 to WL31 are connected to the gates of the memory cells MC0 to MC31, respectively. A selection gate line SGD is connected to the gate of the selection gate transistor TSGD. A selection gate line SGS is connected to the gate of the selection gate transistor TSGS.

Figure 6:
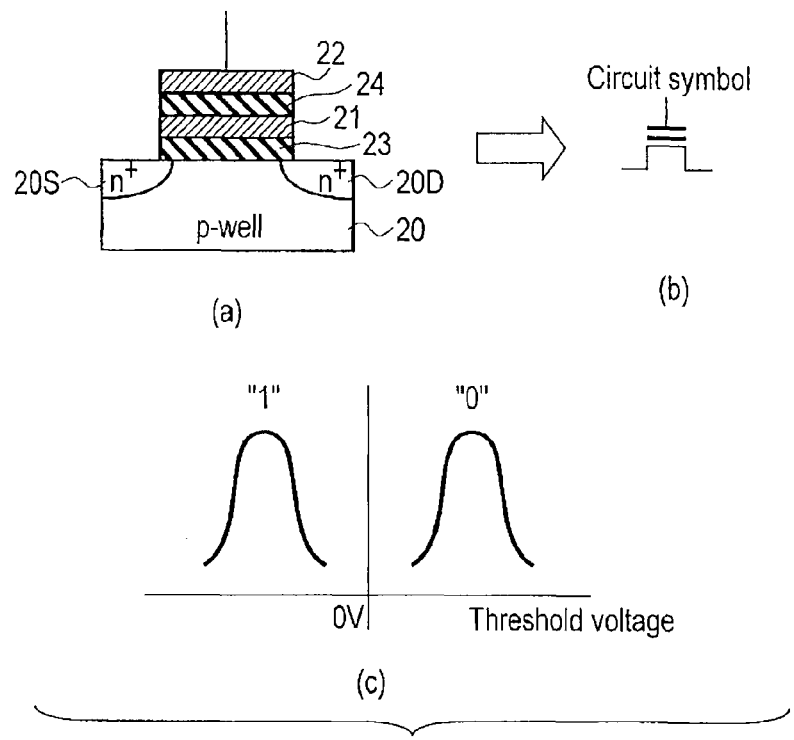
FIG. 6 is a figure illustrating a configuration of a memory cell in the NAND string of the first embodiment.

FIG. 6(a) illustrates a cross sectional structure of a memory cell in the NAND string. FIG. 6(b) illustrates a circuit symbol of the memory cell. FIG. 6(c) illustrates a threshold value distribution of the memory cell.

As shown in FIG. 6(a), one of the memory cells in the flash memory includes a transistor (cell transistor) having a floating gate 21 and a control gate 22.

A semiconductor substrate 20 is formed with a source 20S and a drain 20D. The floating gate 21 is disposed on a semiconductor substrate (channel) between the source 20S and the drain 20D with a tunnel insulating film 23 interposed therebetween. The control gate 22 is disposed on the floating gate 21 with an inter-gate insulating film 24 interposed therebetween.

The cell transistor is given two threshold value distributions by "injecting or discharging" electrons into/from the electrically insulated floating gate 21 as shown in FIG. 6(c). Data "0" and data "1" are assigned to the two threshold value distributions, whereby data are stored to the cell transistor. In this case, the cell transistor stores two values. Alternatively, the present embodiment can also be applied to storage of multiple values.

Subsequently, the write voltage generating circuit 13 and the CG driver 15 in the flash memory as shown in FIG. 1 will be explained in detail.

Figure 7:
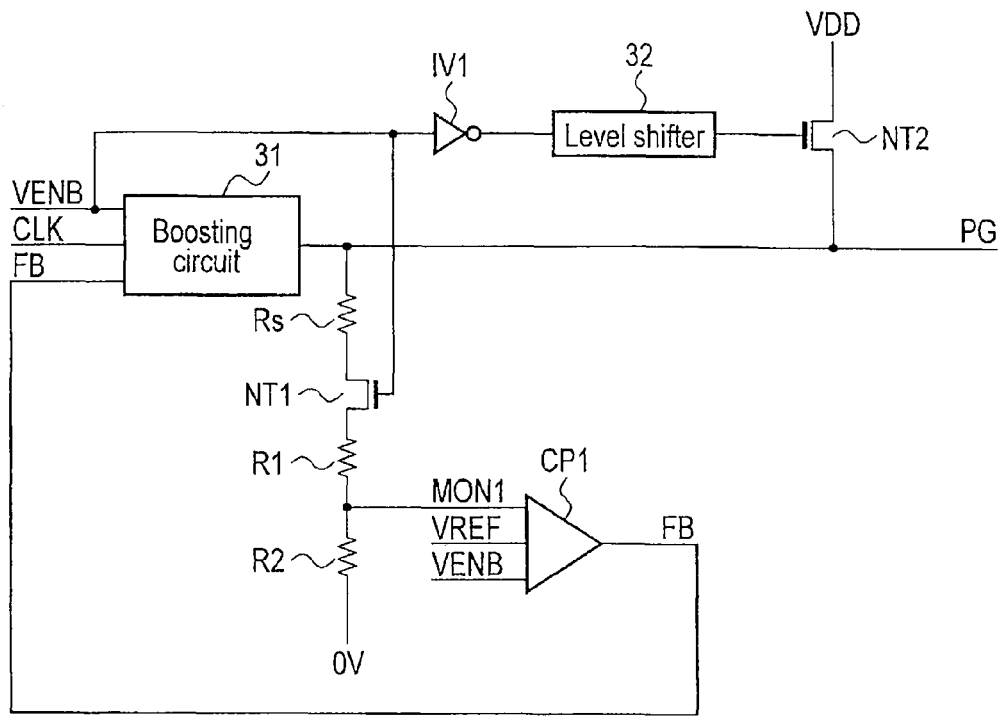
FIG. 7 is a circuit diagram illustrating a configuration of a write voltage generating circuit according to the first embodiment.

FIG. 7 is a circuit diagram illustrating a configuration of the write voltage generating circuit.

As shown in the figure, the write voltage generating circuit 13 includes a boosting circuit 31, a level shifter 32, a comparison circuit CP1, resistors Rs, R1, R2, an inverter IV1, and nMOS transistors NT1, NT2. A limiter circuit is constituted by the comparison circuit CP1, the resistors Rs, R1, R2, and the nMOS transistor NT1. A signal VENB, a feedback signal FB, and a clock CLK are input to the boosting circuit 31. In this case, a circuit for generating the voltage VPGMH is omitted.

Before a write command is input, the signal VENB output from the logical circuit 14 is at "L" level, and accordingly, the boosting circuit 31 goes into a disabled state, and the nMOS transistor NT2 is turned on. As a result, a voltage supply line PG for supplying the write voltage VPGM is reset to an internal voltage VDD. At this occasion, at the time of reset, the level shifter 32 is used to completely transfer the internal voltage VDD to the voltage supply line PG with the nMOS transistor NT2.

Subsequently, when the write command is input, the signal VNEB attains "H" level, and a clock CLK is supplied from an oscillator (not shown). When the signal VENB (="H") is received, the nMOS transistor NT1 is turned on, and the limiter circuit starts operation. The comparison circuit CP1 of the limiter circuit receives a monitor voltage MON1, a reference voltage VREF, and a signal VENB. The limiter circuit compares the reference voltage VREF and a voltage obtained by dividing the voltage VPGM with the resistors Rs, R1, and R2, and the signal FB is given to the boosting circuit 31 as feedback. When the write voltage VPGM does not reach a setting value at this occasion, the signal FB attains "H" level, which causes the boosting circuit 31 to operate. When the voltage VPGM reaches the setting value, the signal FB attains "L" level, which stops the boosting circuit 31. As a result, the write voltage VPGM that is output from the boosting circuit 31 is controlled to attain the setting value (boosted).

FIG. 8 is a circuit diagram illustrating a configuration of the CG driver in FIG. 1.

As shown in the figure, the CG driver 15 includes a switching circuit SW2 and nMOS transistors NT11, NT12, NT13, NT14, NT15 and NT16.

The CG driver 15 is a multiplexer of various kinds of voltages, and determines which voltage is transferred to the control gate line CG according to an enable signal ENB_PRO that is input from the logical circuit 14. For example, in program operation, an enable signal ENB_PRO attains "H" level, and the switching circuit SW2 turns on the nMOS transistor NT11. As a result, the write voltage VPGM is transferred to the control gate line CG.

The voltage of the control gate line CG thus determined is input to the plane determined by the switching circuits SW1, SW1 by decoding, and thereafter, as shown in FIG. 3, the voltage is input to the selected block decoder through a control gate line CGI0 <0: n>. In this manner, the voltage of the control gate line is transferred to the word line WL <0: n>, and the cell transistor is selected.

As necessary, the voltage supplied to the control gate line CG is discharged to 0 V or the voltage VDD in response to a discharge control signal DIS1 or DIS2.

[2] Basic Operation of Program/Program Verification

Subsequently, the basic operation of the program/program verification in the NAND flash memory will be explained. In the explanation about this case, it is assumed that a memory cell connected to an even-numbered bit line BLe within a page (hereinafter referred to as even-numbered page) is programmed.

Figures 9A, 9B:
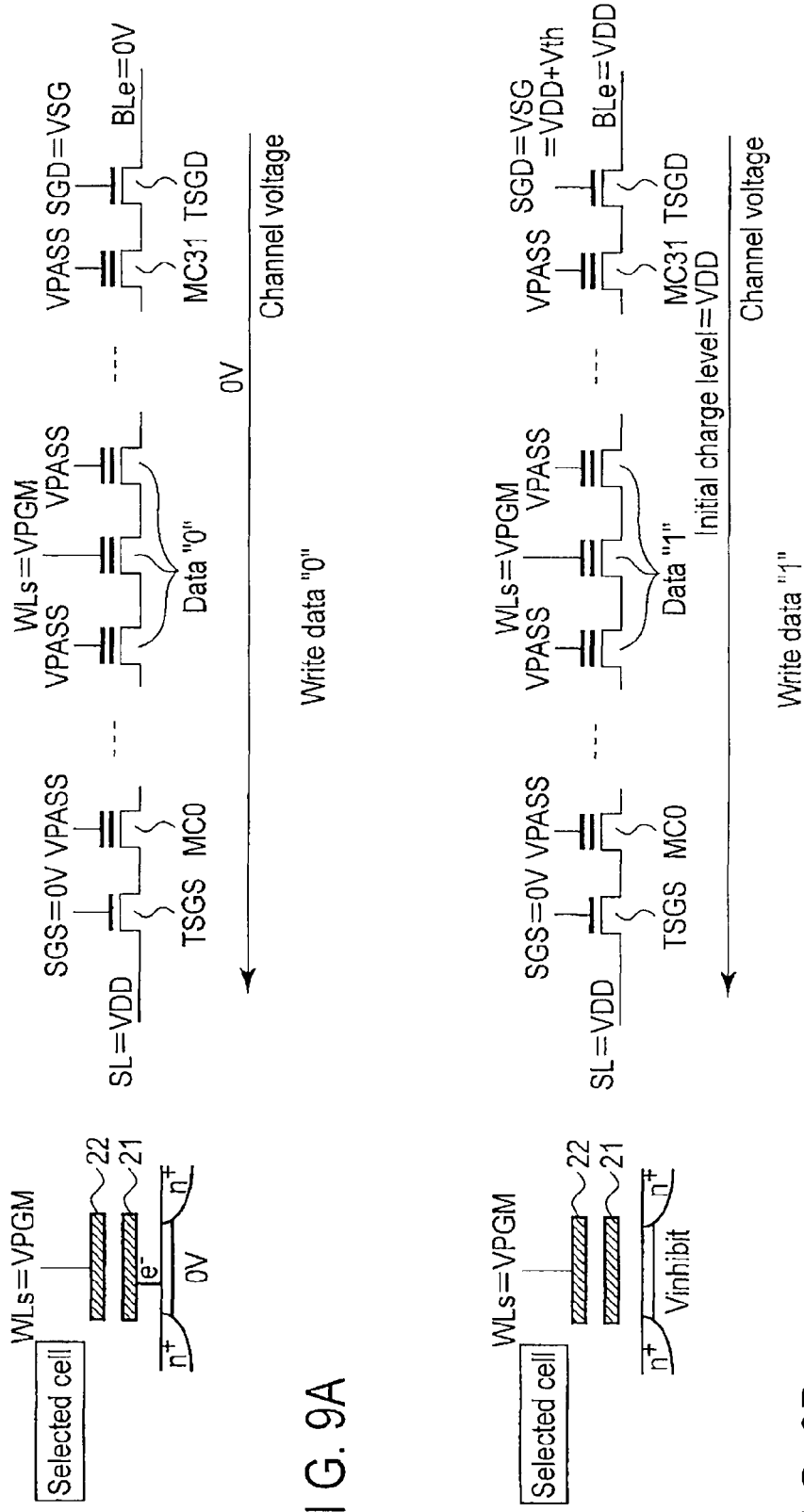
FIGS. 9A and 9B are figures illustrating program operation in the NAND flash memory.

FIGS. 9A and 9B are figures illustrating program operation in the NAND flash memory.

A case where data "0" is written to the selected cell will be explained below. As shown in FIG. 9A, the gate of the selection gate transistor TSGD is set at a voltage VSG, the gate of the selection gate transistor TSGS is set at 0 V, and 0 V is applied from the bit line BLe. In this state, the gate of the non-selected cell is set at a voltage VPASS, and the gate of the selected cell is set at a voltage VPGM.

As a result, the potential difference between the channel voltage (=0 V) of the NAND string and the gate voltage of the selected cell is increased, whereby electrons (e−) are injected into the floating gate 21 of the selected cell. This injection of electrons is achieved with an FN tunnel current. By injecting electrons into the floating gate 21, the selected cell attains a threshold value distribution of the data "0" as shown in FIG. 6(c).

Subsequently, a case where data "1" is written to the selected cell will be explained below. As shown in FIG. 9B, the gate of the selection gate transistor TSGD is set at the voltage VSG, the gate of the selection gate transistor TSGS is set at 0 V, and the voltage VDD is applied from the bit line BLe. In this case, the voltage VSG is a voltage level at which the voltage VDD can be transferred. In this case, VSG=VDD+Vth, where Vth denotes a threshold value of the selection gate transistor TSGD.

At this occasion, the channel of the NAND string is in a floating state when the voltage VDD is transferred. This is because the gate-source voltage applied to the selection gate transistor TSGD at the side of the bit line BLe exactly attains the threshold value voltage Vth. In this state, when the gate of the non-selected cell is set at a voltage VPASS, and the gate of the selected cell is set at the voltage VPGM, the channel of the NAND string increases due to the coupling with the selected cell. This increased potential is denoted as Vinhibit.

At this occasion, since the voltage difference applied between the gate of the selected cell and the channel of the NAND string is small, electrons are not injected into the floating gate 21. This state in which no electron is injected is a threshold value distribution of the data "1" as shown in FIG. 6(c). In program operation with an even-numbered bit line BLe, a cell connected to an odd-numbered bit line BLo is not selected, and therefore, the programming operation with an even-numbered bit line BLe is the same operation as the program operation (writing of data "1") as shown in FIG. 9B.

After the above program operation is performed, program verification operation is performed in order to confirm whether desired data is written or not.

FIG. 10B, FIG. 10C, and FIG. 10D are figures illustrating program verification operation in the NAND flash memory.

In the following case, data having a threshold value distribution as shown in FIG. 10A is programmed. After data "0", "1" is written to the selected cell as described above, the word line WL of the selected cell is set at a voltage VSEN, and the bit line BLe is set at a voltage VDD (initial charge level). The bit line BLo at the non-selected page side is fixed to 0 V.

Further, the gate of the non-selected cell is set at a voltage VREAD, and the gates of the selection gate transistors TSGD, TSGS are set at the voltage VSG. In this case, as shown in FIG. 10A, the voltage VREAD is a voltage level higher than the highest voltage level in the threshold value distribution of the data "0". Therefore, the cell of which gate receives the voltage VREAD can pass a current regardless whether the data is "0" or "1".

Thereafter, the bit line BLe is set at floating state, and as shown in FIGS. 10B and 10C, a determination is made as to whether desired data is programmed or not by checking whether the initial charge level of the bit line BLe is discharged or maintained. At this occasion, since the bit line BLe is in the floating state, false sensing is likely to occur due to noises. In order to avoid this false sensing, as shown in FIG. 10D, the sensing process is performed while the bit lines BLo at either side of the bit line BLe are fixed to 0 V, and the bit line BLe is shielded.

[3] Shut Off of Power Supply During Program Operation and Problems Associated Therewith Now, operation for shutting off the power supply VEXT during the program operation will be considered.

First, the block decoder 170 selects a block to be programmed according to an address ADD0. The transfer node TRN in the selected block decoder is boosted, whereby the control gate line CGI0 and the word line WL are connected.

During the program operation, the write voltage VPGM is applied to the gate of the selected cell, and likewise, the write voltage VPGM is also applied to a cell of the same word line WL (non-selected cell). However, the channel of the non-selected NAND string is boosted (the potential at the floating node is increased by coupling), and therefore, the potential difference between the gate and the channel does not increase and write operation is not performed.

For example, suppose a case where, when data has been already written to a cell connected to an even-numbered bit line BLe (even-numbered page), data is written to a subsequent cell connected to an odd-numbered bit line BLo (hereinafter referred to as odd-numbered page). In this case, the write voltage VPGM is applied to the gate of the selected cell of the odd-numbered page. At this occasion, since the even-numbered page is non-selected, the channel is boosted, and no write operation should not be performed.

However, when the power supply VEXT is shut off while the write voltage VPGM is applied to the gate of the selected cell, problems may occur. For example, when the subsequent odd-numbered page is programmed after the even-numbered page has already been programmed, the following problem may occur. When the power supply VEXT is shut off while the voltage VPGM is applied to the selected cell, charge is lost in the transfer node TRN in the block decoder before the word line WL is discharged to 0 V with the control gate line CG. Accordingly, the word line WL becomes floating state, and the write voltage VPGM remains in the word line WL.

At this occasion, charge of the voltage VPGM also remains in the gate of a non-write cell of which gate receives the voltage VPGM (in this case, a cell having "1" written therein in an even-numbered page or an odd-numbered page). If the device is left in this state, the boosted potential of the channel is lost by leakage, and the potential difference between the gate and the channel increases. As a result, error write operation may be performed on the non-selected cell and the selected cell having "1" written therein. Among them, error write operation to the non-selected cell is particularly serious problem.

Therefore, in order to prevent the above error write operation, it is necessary to terminate the program operation upon detecting decrease of the power supply VEXT. In this case, FIG. 11 shows an example of a detecting circuit of the power supply VEXT. FIG. 12 shows an example of a detection voltage.

First, the lowest level of the power supply VEXT at which operation is guaranteed is defined by a specification, and as shown in FIG. 12, this voltage level is adopted as a voltage Vmin. When the power supply VEXT is given and it becomes more than a voltage Vmin, flash memory having a ROM fuse or a metal fuse fetches the fuse information and latches the fuse information in a register in a peripheral circuit (for example, a register in the logical circuit 14). After the fuse information has been normally latched, the flash memory goes into standby state.

Subsequently, operation at drop of the power supply VEXT (power off) will be considered. At this occasion, the voltage level at which the flash memory detects OFF state of the power supply is referred to as an OFF voltage Voff. When the power supply VEXT becomes less than the OFF voltage Voff, the flash memory is reset. As a result, the register information in the flash memory is initialized, and all logical control signals are reset.

The lower the voltage specification of the flash memory is, the lower the voltage level of the voltage Vmin is, and the OFF voltage Voff decreases according to the decreased voltage level. For example, when Vmin is 1.50 V, Voff is 1.40 V.

In this case, in order to prevent error write operation due to shut off of the power supply VEXT, the recovery operation is performed at a voltage between the voltage Vmin and the OFF voltage Voff, and accordingly a recovery voltage Vrcv at which the recovery operation starts is, for example, 1.45 V. When the power supply VEXT becomes less than the recovery voltage Vrcv, the flash memory goes into recovery mode even in the program operation, and the program operation is terminated. In this case, the recovery operation is operation for terminating the program in the same order as the processing executed during normal termination of the program operation when the power supply VEXT becomes less than the recovery voltage Vrcv.

However, when the power supply VEXT becomes less than the OFF voltage Voff even in the recovery operation, the flash memory is initialized and, the logical control signal is reset. Therefore, in order to normally terminate the recovery operation, it is necessary to finish the recovery operation before the power supply VEXT drops from the voltage Vrcv to the voltage Voff. The lower the voltage specification of memory is, the smaller the potential difference between the recovery voltage Vrcv and the voltage Voff is, and the margin of the recovery operation against shut off of the power supply VEXT decreases.

The circuit for detecting the external power supply VEXT as shown in FIG. 11 needs to operate at all times even in the standby state. For this reason, the current of the detecting circuit is at a very low level in most cases, which results in slow detection speed. Therefore, it takes much time to detect the power supply VEXT decreasing to a level less than the recovery voltage Vrcv, and during the recovery operation, the power supply VEXT may become lower than the OFF voltage Voff, which is considered to disable normal execution of the recovery operation.

[4] Solution in First Embodiment

As described above, one of the problems associated with shut off of the power supply includes slow response speed of the circuit that detects the voltage level of the power supply VEXT. This is because of the following reasons. It is necessary to keep the detecting circuit of the power supply VEXT operating at all times no matter whether the flash memory is active or standby state, and the current of the detecting circuit is at a very low level in order to reduce the consumption current of the detecting circuit.

In the power supply detecting circuit as shown in FIG. 11, a resistance ratio of the resistors R3, R4 is set according to a voltage to be detected, and the comparison circuit CP2 compares the reference voltage VREF and the monitor voltage MON2 at the node between the resistors R3 and R4. Then, a flag signal FLG is output as a comparison result.

When the monitor voltage MON2 is determined to be equal to or more than the reference voltage VREF, the comparison circuit CP2 outputs "H" as the flag signal FLG. On the other hand, when the monitor voltage MON2 is determined to be less than the reference voltage VREF, the comparison circuit CP2 outputs "L" as the flag signal FLG. At this occasion, the current constantly flows through the resistors R3, R4, and the current of the comparison circuit CP2 constantly flows, which increases the standby current. Accordingly, in order to reduce the consumption current, these currents are reduced, but this in turn reduces the response speed of the power supply detecting circuit.

In the first embodiment, in order to overcome shut off of the power supply during the program operation which may cause error write operation, the operation of the power supply detecting circuit is performed at a faster speed only during the program operation.

FIG. 13 is a circuit diagram illustrating a recovery voltage detecting circuit according to the first embodiment.

As shown in the figure, the recovery voltage detecting circuit includes a low speed detecting circuit 41 for detecting the power supply VEXT at a normal speed and a high speed detecting circuit 42 for detecting the power supply VEXT at a high speed.

The low speed detecting circuit 41 includes resistors R5, R6, a comparison circuit CP5, and an AND circuit ADS. The low speed detecting circuit 41 is a circuit for operating at all times both in the standby state and the active state. In an operation other than the program operation, the low speed detecting circuit 41 detects whether the power supply VEXT is equal to or more than the recovery voltage (first voltage) Vrcv or not, i.e., the low speed detecting circuit 41 detects whether the power supply VEXT is less than the recovery voltage Vrcv or not.

The high speed detecting circuit 42 includes resistors R7, R8, an nMOS transistor NT17, a comparison circuit CPF, and an AND circuit ADF. Only in the program operation (when the enable signal ENB is at "H" level), the high speed detecting circuit 42 detects whether the power supply VEXT is equal to or more than the recovery voltage (first voltage) Vrcv or not, i.e., the high speed detecting circuit 42 detects whether the power supply VEXT is less than the recovery voltage Vrcv or not at a speed higher than the low speed detecting circuit 41. In this case, the enable signal ENB is a logical signal that becomes "H" level during the program operation (excluding the program verification) of the flash memory and that becomes "L" level during operation other than the program operation. The disable signal ENBn is an inversion signal of the enable signal ENB.

The operation of the recovery voltage detecting circuit during the program operation is as follows.

During the program operation, the enable signal ENB becomes "H" level, and the disable signal ENBn becomes "L" level. As a result, the AND circuit ADS attains disabled state, and the AND circuit ADF attains enabled state. The outputs of the AND circuits ADS, ADF are given to an OR circuit OR1, and the OR circuit OR1 outputs the output of the AND circuit ADF via a delay circuit DEL1 as the flag signal FLG. In other words, the detection result of the high speed detecting circuit 42 is output to the flag signal FLG.

More specifically, in the high speed detecting circuit 42, "H" serving as the enable signal ENB is input to the gate of the nMOS transistor NT17, the comparison circuit CPF, and the AND circuit ADF, and these circuits attain ON state or enabled state.

The comparison circuit CPF compares the reference voltage VREF and the monitor voltage MONF at the node between the resistors R7 and R8, and a flag signal FLGF is output as a comparison result. Since the AND circuit ADF receives "H" as the enable signal ENB, the flag signal FLGF is output from the AND circuit ADF to the OR circuit OR1.

In the low speed detecting circuit 41, the AND circuit ADS receives "L" as the disable signal ENBn, and the AND circuit ADS outputs "L" to the OR circuit OR1 at all times.

The OR circuit OR1 outputs the flag signal FLGF to the delay circuit DEL1. The flag signal FLGF is output as the flag signal FLG via the delay circuit DEL1. In other words, the flag signal FLGF, i.e., the detection result of the high speed detecting circuit 42, is output from the recovery voltage detecting circuit.

The operation of the recovery voltage detecting circuit during operation other than the program operation is as follows.

In operation other than the program operation, the enable signal ENB becomes "L", and the disable signal ENBn becomes "H". As a result, the AND circuit ADS attains enabled state, and the AND circuit ADF attains disabled state. The OR circuit OR1 outputs a flag signal FLGS to the delay circuit DEL1. The flag signal FLGS outputs the flag signal FLG via the delay circuit DEL1. In other words, the flag signal FLGS, i.e., the detection result of the low speed detecting circuit 41, is output from the recovery voltage detecting circuit.

More specifically, in the low speed detecting circuit 41, "H" serving as the disable signal ENBn is input to the AND circuit ADS, and the AND circuit ADS attains enabled state.

The comparison circuit CPS compares the reference voltage VREF and the monitor voltage MONS at the node between the resistors R5 and R6, and the flag signal FLGS is output as a comparison result. Since the AND circuit ADS receives "H" as the signal ENBn, the flag signal FLGS is output from the AND circuit ADS to the OR circuit OR1.

In the high speed detecting circuit 42, "L" serving as the enable signal ENB is input to the gate of the nMOS transistor NT17, the comparison circuit CPF, and the AND circuit ADF, and these circuits attain OFF state or disabled state. Therefore, the AND circuit ADF outputs "L" to the OR circuit OR1 at all times.

The OR circuit OR1 outputs a flag signal FLGS to the delay circuit DEL'. The flag signal FLGS outputs the flag signal FLG via the delay circuit DEL1. In other words, the flag signal FLGS, i.e., the detection result of the low speed detecting circuit 41, is output from the recovery voltage detecting circuit.

While the enable signal ENB is at "L", the high speed detecting circuit 42 does not operate, and the current consumed during operation other than the program operation does not increase. The delay circuit DEL1 operates so as to remove power supply noise (glitch) during switching of the AND circuits ADS, ADF and serve as a filter against the power supply noise in response to increase of the detection sensitivity during operation of the high speed detecting circuit 42.

As described above, in the first embodiment, the high speed detecting circuit is introduced, so that the speed of detecting the power supply is increased, and the high speed detecting circuit applies control for activation only during the active operation (in this case, only during the program operation). As a result, while the standby current is reduced, as shown in FIG. 14, the margin of the recovery operation in response to shut off of the power supply can be increased (i.e., recovery time can be ensured). As a result, the reliability against shut off of the power supply can be enhanced. In other words, error write operation can be prevented.

The above high speed detecting circuit can be applied to not only detection of the recovery voltage Vrcv but also detection of the OFF voltage Voff. In such case, variation of the DC offset voltage of the high speed detecting circuit can also be cancelled.

In the present embodiment, in the control against shut off of the power supply that is supplied to the flash memory, error write operation can be prevented that occurs due to shut off of the power supply during application of a high voltage to the gate of a memory cell, e.g., during write (program) operation.

As described above, according to the present embodiment, for example, error write operation caused by shut off of the power supply, which is a serious problem in the NAND flash memory used in a mobile device and the like, can be prevented, and the highly reliable NAND flash memory can be made.

[Second Embodiment]

In the first embodiment, the speed of the power supply detecting circuit is increased, which detects shut off of the power supply VEXT at a high speed, so that the device goes into recovery operation more quickly, which prevents error write operation. Since the recovery operation at that occasion uses the normal processing of the program operation, it may take some time from when the external power supply is detected to when the write voltage VPGM applied to the selected word line is actually discharged.

If it takes much time to actually discharge the voltage VPGM of the word line after going into the recovery operation, error write operation may occur just the same. This is because, before the recovery operation is finished, the power supply VEXT becomes lower than the OFF voltage Voff which resets the logical circuit, or the power supply VEXT becomes lower than the minimum voltage at which the logical circuit operates.

Therefore, in the second embodiment, the device prevents error write operation not only by entering into the normal recovery operation at a high speed using the flag signal FLG indicating detection of shut off of the power supply by the high speed detecting circuit 42 like the first embodiment, but also by directly performing the recovery operation in the write voltage generating circuit.

Figure 15:
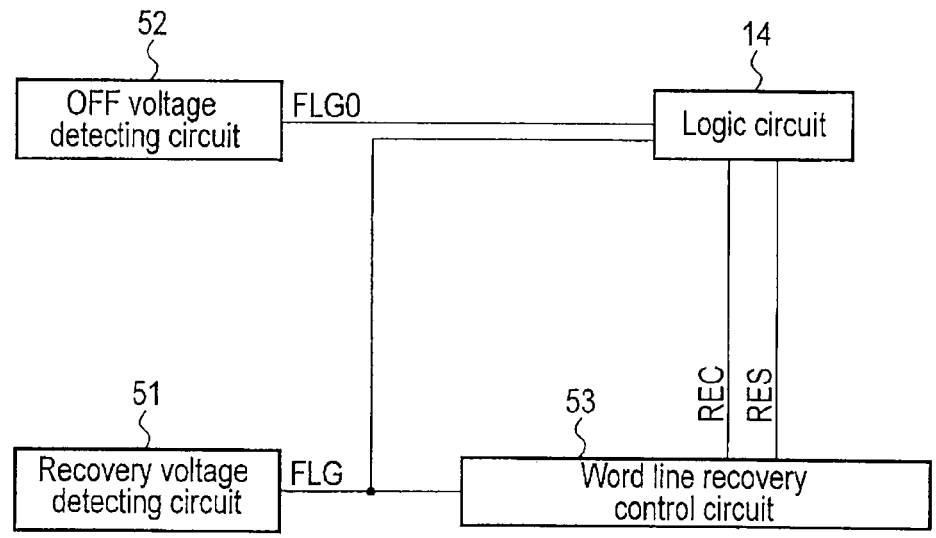
FIG. 15 is a block diagram including a power supply detecting circuit and a word line recovery control circuit according to a second embodiment.

FIG. 15 is a block diagram including a power supply detecting circuit and a word line recovery control circuit according to the second embodiment.

FIG. 15 illustrates a recovery voltage detecting circuit 51 and an OFF voltage detecting circuit 52 as power supply detecting circuits for detecting shut off of the power supply VEXT. The recovery voltage detecting circuit 51 has, for example, the circuit as shown in FIG. 13. The OFF voltage detecting circuit 52 has, for example, the circuit as shown in FIG. 11. In this case, it is assumed that the reference voltage VREF in FIG. 11 is set at a voltage for detecting an OFF voltage Voff, and a comparison circuit CP2 outputs a flag signal FLG0.

The recovery voltage detecting circuit 51 detects whether the power supply VEXT is equal to or more than a recovery voltage Vrcv, and outputs a flag signal FLG, i.e., the detection result, to a word line recovery control circuit 53. The word line recovery control circuit 53 performs recovery operation on a word line according to the flag signal FLG. The flag signal FLG output from the recovery voltage detecting circuit 51 is also output to a logical circuit 14. The logical circuit 14 outputs a recovery signal REC to the word line recovery control circuit 53 according to the flag signal FLG. The word line recovery control circuit 53 performs recovery operation on the word line according to the recovery signal REC. The recovery signal REC includes a signal VENB and a signal ENB_PRO.

In this case, the power supply VEXT is shut off during the program operation, and when the power supply VEXT becomes lower than the recovery voltage Vrcv, the flag signal FLG output from the recovery voltage detecting circuit 51 is directly output to the word line recovery control circuit 53. When the power supply VEXT becomes lower than the recovery voltage Vrcv during operation other than the program operation, e.g., during reading or erasing operation, the flag signal FLG is output to the logical circuit 14, and the recovery signal REC is output from the logical circuit 14 to the word line recovery control circuit 53. This is because, when the power supply VEXT becomes lower than the recovery voltage Vrcv during the program operation, high speed recovery operation is required, but during operation other than the program operation, high speed recovery operation is not required, and ordinary recovery operation is sufficient.

Further, the OFF voltage detecting circuit 52 detects whether the power supply VEXT is equal to or more than the OFF voltage (second voltage) Voff, and outputs a flag signal FLG0, i.e., the detection result, to the logical circuit 14. The logical circuit 14 outputs a reset signal RES to the word line recovery control circuit 53 according to the flag signal FLG0. The word line recovery control circuit 53 performs reset operation for stopping operation in the circuit according to the reset signal RES.

In the second embodiment, the write voltage generating circuit 13 in the block diagram as shown in FIG. 1 is replaced with a write voltage generating circuit 13A explained below.

In FIG. 15, the word line recovery control circuit 53 has the write voltage generating circuit 13A. The configuration other than the above is the same as the configuration as shown in FIG. 1.

Figure 16:
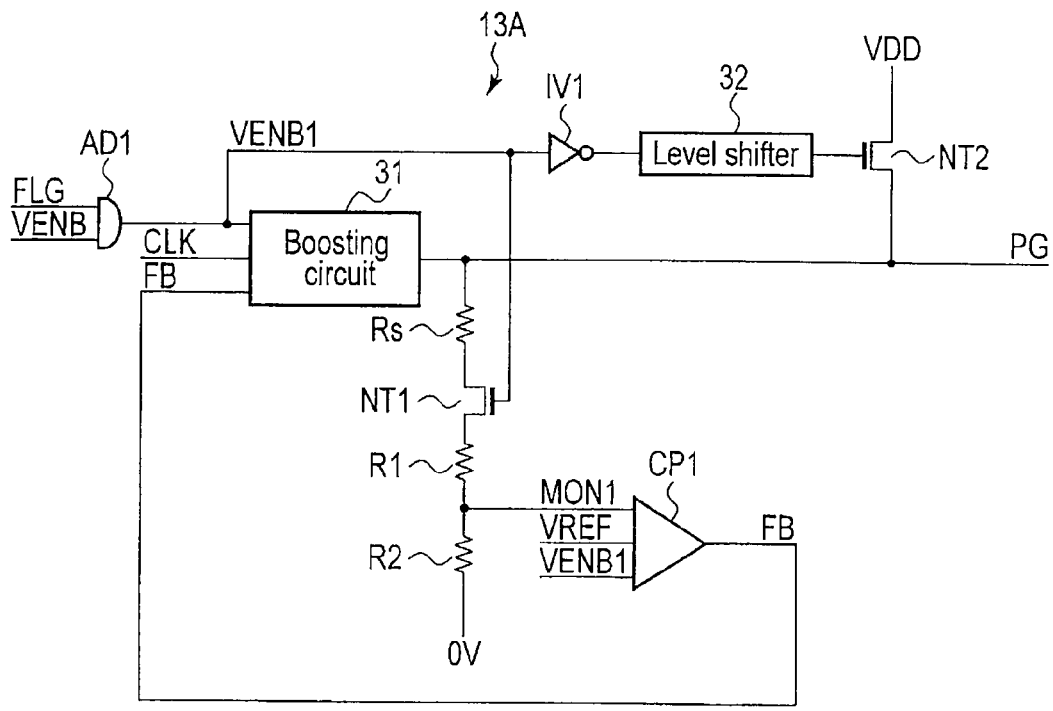
FIG. 16 is a circuit diagram illustrating a write voltage generating circuit according to the second embodiment.

FIG. 16 is a circuit diagram illustrating a write voltage generating circuit according to the second embodiment.

As shown in the figure, the write voltage generating circuit 13A includes an AND circuit AD1 in addition to the circuit as shown in FIG. 7. The AND circuit AD1 receives the signal VEND output from the logical circuit 14 and the flag signal FLG output from the recovery voltage detecting circuit 51. The AND circuit AD1 outputs a signal VENB1 to a boosting circuit 31, an inverter IV1, and an nMOS transistor NT1.

When the power supply is shut off during the program operation, the recovery voltage detecting circuit 51 detects the power supply VEXT becoming lower than the recovery voltage Vrcv at a high speed, and the flag signal FLG changes to "L" level. Then, the signal VENB1 output from the AND circuit AD1 attains "L" level, and immediately stops the boosting circuit 31. Further, the signal VENB1 is input to the gate of the nMOS transistor (discharge circuit) NT2 via the inverter IV1 and the level shifter 32. As a result, the nMOS transistor NT2 is turned on, and the write voltage VPGM supplied to the voltage supply line PG is discharged to the voltage VDD (recovery operation). In other words, the write voltage VPGM supplied to the voltage supply line PG is discharged, and the potential of the voltage supply line PG is set at the voltage VDD.

As described above, shut off of the power supply VEXT is detected at a high speed, and the write voltage generating circuit 13A itself is recovered without causing the CG driver 15 to recover (discharge) the voltage VPGM applied to the word line WL, so that error write operation is prevented more reliably. In the second embodiment, the detection signal (the flag signal FLG) is not transmitted by way of the logical circuit but is directly input to the word line recovery control circuit 53, i.e., the write voltage generating circuit 13A. Therefore, the recovery operation can be performed at a higher speed in the second embodiment than in the first embodiment. The configuration and effects other than the above are the same as those of the first embodiment.

[Third Embodiment]

In the first embodiment, the speed of the power supply detecting circuit is increased, which detects shut off of the power supply VEXT at a high speed, so that the device goes into recovery operation more quickly, which prevents error write operation. Since the recovery operation at that occasion uses the normal processing of the program operation, it may take some time from when the external power supply is detected to when the write voltage VPGM applied to the selected word line is actually discharged. If it takes much time to actually discharge the voltage VPGM of the word line after going into the recovery operation, error write operation may occur just the same.

Therefore, in the third embodiment, the device prevents error write operation not only by entering into the normal recovery operation at a high speed using the flag signal FLG indicating detection of shut off of the power supply by the high speed detecting circuit 42 like the first embodiment, but also by directly performing the recovery operation in the CG driver.

In the third embodiment, the CG driver 15 in the block diagram as shown in FIG. 1 is replaced with a CG driver 15A explained below. In FIG. 15, a word line recovery control circuit 53 has the CG driver 15A. The configuration other than the above is the same as the configuration as shown in FIG. 1.

FIG. 17 is a circuit diagram illustrating the CG driver according to the third embodiment, and shows the circuit for discharging a voltage VPGM applied to a word line WL at a high speed.

As shown in the figure, the CG driver 15A includes an AND circuit AD2 and a discharge circuit 54 in addition to the circuit as shown in FIG. 8. The AND circuit AD2 receives a signal ENB_PRO output from a logical circuit 14 and a flag signal FLG output from a recovery voltage detecting circuit 51. The output of the AND circuit AD2 is input to a switching circuit SW2. The discharge circuit 54 discharges the write voltage VPGM applied to a control gate line (voltage supply line) CG to a voltage VDD according to the flag signal FLG. In other words, the write voltage VPGM supplied to the control gate line CG is discharged, and the potential of the control gate line CG is set at the voltage VDD.

When the power supply VEXT is equal to or more than the recovery voltage Vrcv during the program operation, the flag signal FLG attains "H" level, and the signal ENB_PRO attains "H" level. Therefore, the switching circuit SW2 for transferring the write voltage VPGM to the control gate line CG is in enabled state. As a result, an nMOS transistor (transfer circuit) NT11 is turned on, and the write voltage VPGM is transferred to the control gate line CG.

When the flag signal FLG is at "H" level, the gate of a depletion type nMOS transistor NT18 is at "L(0 V)", and the gate of the pMOS transistor PT1 is at "H" level. Therefore, the nMOS transistor NT18 and the pMOS transistor PT1 are in OFF state, and the discharge circuit 54 does not pass any current. In other words, in normal operation, the discharge circuit 54 does not pass any current. It should be noted that the depletion type nMOS transistor NT18 is an nMOS transistor whose threshold value voltage is negative.

Subsequently, when the recovery voltage detecting circuit 51 detects the power supply VEXT becoming lower than the recovery voltage Vrcv during the program operation, the flag signal FLG attains "L" level. Since the flag signal FLG attains "L" level, the switching circuit SW2 becomes disabled state. As a result, the nMOS transistor NT11 is turned off, connection between the write voltage VPGM and the control gate line CG is shut off (recovery operation).

At the same time, the flag signal FLG ("L") is input to the gate of the pMOS transistor PT1, and is also input to the gate of the nMOS transistor NT18 via an inverter IV2. As a result, the pMOS transistor PT1 and the nMOS transistor NT18 are turned on, and the potential of the control gate line CG is immediately discharged through the discharge circuit 54 from the write voltage VPGM to the voltage VDD (recovery operation).

As described above, shut off of the power supply VEXT is detected at a high speed, and the detection signal (the flag signal FLG) is directly input to the CG driver 15A, so that the recovery operation in the CG driver 15A is performed at a high speed. This prevents error write operation more reliably. In the third embodiment, the detection signal (the flag signal FLG) is not transmitted by way of the logical circuit but is directly input to the word line recovery control circuit 53, i.e., the CG driver 15A. Therefore, the recovery operation can be performed at a higher speed in the third embodiment than in the first embodiment. The configuration and effects other than the above are the same as those of the first embodiment.

[Fourth Embodiment]

According to the first to third embodiments, shut off of the power supply VEXT is detected at a high speed, and the device enters into the recovery operation at a high speed, so that error write operation can be prevented. However, when shut off of the power supply VEXT is performed at a still higher speed, and the power supply VEXT gets lower than the OFF voltage Voff before the time when the recovery operation is finished, the flash memory enters into the reset operation. For this reason, the logical circuit (control circuit) stops all the recovery operation and is reset, which may cause error write operation.

Therefore, in the fourth embodiment, a delay circuit is provided between the logical circuit and the circuit for detecting the OFF voltage Voff, wherein the delay circuit has the same delay time as the time from the recovery voltage Vrcv is detected to when the recovery operation is actually finished. This delay circuit delays the time from when the OFF voltage Voff is detected to when the logical circuit starts the reset operation, whereby the recovery operation time is ensured.

FIG. 18 is a block diagram including a power supply detecting circuit and a word line recovery control circuit according to the fourth embodiment.

In the fourth embodiment, a delay circuit 55 is provided between an OFF voltage detecting circuit 52 and a logical circuit 14 in the block diagram as shown in FIG. 15. The configuration other than the above is the same as the configuration as shown in FIG. 1.

In this case, the OFF voltage detecting circuit 52 and a recovery voltage detecting circuit 51 constitute a power supply detecting circuit having the high speed detecting circuit described in the first embodiment. The detection voltage level of the recovery voltage Vrcv (for example, 1.45 V) detected by the recovery voltage detecting circuit 51 is higher than the detection voltage level of the OFF voltage Voff (for example, 1.40 V) detected by the OFF voltage detecting circuit 52. It should be noted that filter circuit may be respectively disposed downstream of the OFF voltage detecting circuit 52 and the recovery voltage detecting circuit 51. The filter circuit is a circuit for processing, e.g., noises of the power supply and glitch in the flag signals output from the OFF voltage detecting circuit 52 and the recovery voltage detecting circuit 51.

First, when the power supply VEXT drops due to shut off of the power supply VEXT during the program operation, and the power supply VEXT becomes less than the recovery voltage Vrcv, the flag signal FLG output from the recovery voltage detecting circuit 51 changes from "H" level to "L" level. The flag signal FLG ("L") is input to the word line recovery control circuit 53. The word line recovery control circuit 53 performs the recovery operation according to the flag signal FLG. In other words, the word line recovery control circuit 53 discharges the voltage supplied to a word line according to the flag signal FLG.

At this occasion, the delay circuit 55 is inserted into a transmission path of a flag signal FLG0. The delay circuit 55 is a circuit simulating a time from when the flag signal FLG changes from "H" level to "L" level to when the word line recovery operation is actually finished. In other words, the delay circuit 55 is inserted between the OFF voltage detecting circuit 52 and the logical circuit 14. The delay time simulated by the delay circuit 55 is a summation of a recovery operation time and a delay that actually occurs in the flag signal FLG before reaching the word line recovery control circuit 53, e.g., the number of logical stages and an RC delay.

As described, in the fourth embodiment, the delay circuit 55 simulating the time from when the recovery voltage Vrcv is detected to when the recovery operation is finished is inserted into the transmission path of the flag signal FLG0. As a result, shut off of the power supply occurs at a high speed, even if the time it takes for the power supply VEXT to drop from the voltage Vrcv to the voltage Voff is shorter than the time from when the flag signal FLG changes from "H" level to "L" level to when the recovery operation is finished, the reset operation of the logical circuit 14 caused by the transition of the flag signal FLG0 from "H" level to "L" level is ensured to be performed after the recovery operation is finished. As a result, error write operation can be prevented even when the power supply is shut off at a still higher speed. The configuration and effects other than the above are the same as those of the first embodiment.

In the above embodiments, the flag signal FLG is directly input to the word line recovery control circuit 53, and the word line recovery control circuit 53 performs the recovery operation. However, the embodiments can also be applied even when the flag signal FLG is input to the logical circuit 14 and the recovery operation is performed in response to the recovery signal REC provided from the logical circuit 14. In this case, the delay time of the delay circuit 55 may be set as a time from when the flag signal FLG changes from "H" level to "L" level to when the recovery operation in response to the recovery signal REC provided by the logical circuit 14 is finished.

As explained above, according to the first to fourth embodiments, error write operation caused by shut off of the power supply is prevented, and the highly reliable semiconductor memory device can be provided.

In the first to fourth embodiments, all the reference voltages are represented as VREF. However, it is assumed that the reference voltage VREF is set at a voltage needed in each circuit. For example, in the write voltage generating circuit, the reference voltage VREF is set at a voltage for controlling the write voltage so that the write voltage attains a setting value. Further, in the recovery voltage detecting circuit, the reference voltage VREF is set at a voltage for detecting the recovery voltage Vrcv, and in the OFF voltage detecting circuit, voltage is set at a voltage for detecting the OFF voltage Voff.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array that has memory cells each connected to a word line and a bit line;
   a first detecting circuit that outputs a first detection signal which shows whether an externally supplied external power supply is equal to or more than a first voltage;
   a second detecting circuit that outputs, at a higher speed than the first detecting circuit, a second detection signal which shows whether the external power supply is equal to or more than the first voltage;
   a switching circuit, wherein in a write operation that applies a write voltage to a word line connected to the memory cell, the switching circuit outputs the second detection signal that is output from the second detecting circuit, and in an operation other than the write operation, the switching circuit outputs the first detection signal that is output from the first detecting circuit; and
   a recovery control circuit that terminates the write operation according to the second detection signal that is output from the switching circuit.

2. The semiconductor memory device according to claim 1, further comprising a boosting circuit that supplies the write voltage to a first voltage supply line electrically connected to the word line when the second detection signal is determined to be equal to or more than the first voltage during the write operation,
   wherein the recovery control circuit comprises a discharge circuit that discharges the write voltage supplied to the first voltage supply line when the second detection signal is determined to be less than the first voltage.

3. The semiconductor memory device according to claim 1, further comprising:
   a first voltage supply line that supplies a voltage to the word line;
   a second voltage supply line that is connected between the first voltage supply line and the word line;
   a transfer circuit that changes a state between the first voltage supply line and the second voltage supply line to either a conducting state or a non-conducting state; and
   a further switching circuit that switches the transfer circuit to either the conducting state or the non-conducting state,
   wherein the recovery control circuit comprises a discharge circuit that discharges the write voltage transferred to the second voltage supply line according to the second detection signal that is output from the switching circuit.

4. The semiconductor memory device according to claim 1, further comprising:
   a third detecting circuit that detects whether the external power supply is equal to or more than the second voltage, and outputs a third detection signal;
   a logical circuit that resets operation of the recovery control circuit according to the third detection signal that is output from the third detecting circuit; and
   a delay circuit that delays input of the third detection signal into the logical circuit by a time it takes for the recovery control circuit to discharge the write voltage supplied to the first voltage supply line when the third detection signal is determined to be less than the second voltage.

5. The semiconductor memory device according to claim 1, wherein when the second detection signal is determined to be equal to or more than the first voltage, the recovery control circuit continues the write operation, and when the second detection signal is determined to be less than the first voltage, the recovery control circuit terminates the write operation.

6. The semiconductor memory device according to claim 1, wherein the first detecting circuit operates in a standby state and an active state, and the second detecting circuit operates during the write operation in the active state.

7. The semiconductor memory device according to claim 6, wherein the second detecting circuit does not operate in operation other than the write operation.

8. The semiconductor memory device according to claim 1, wherein the first voltage is a voltage at which operation for terminating the write operation is started.

9. The semiconductor memory device according to claim 1, wherein the second voltage is a voltage at which an OFF state of the power supply is detected.

10. The semiconductor memory device according to claim 1,
    wherein the bit line includes an even-numbered bit line arranged in an even-numbered position and an odd-numbered bit line arranged in an odd-numbered position, and
    the write operation is performed by performing a first write operation to one of the even-numbered bit line and the odd-numbered bit line and thereafter performing a second write operation to the other of the even-numbered bit line and the odd-numbered bit line.

11. The semiconductor memory device according to claim 1,
wherein the memory cell array includes NAND flash memory.

12. The semiconductor memory device according to claim 1,
wherein the first detecting circuit comprises a first comparison circuit that compares the external power supply with the first voltage to output the first detection signal,
the second detecting circuit comprises a second comparison circuit that compares the external power supply with the first voltage to output the second detection signal in the write operation, and
the switching circuit comprises a first logical circuit and a second logical circuit, the first logical circuit outputting the first detection signal in the operation other than the write operation, the second logical circuit outputting the second detection signal in the write operation.

13. The semiconductor memory device according to claim 1, further comprising:
first voltage supply lines that supply a voltage to the word line;
a second voltage supply line that is connected between the first voltage supply lines and the word line;
transfer transistors that are connected between the first voltage supply lines and the second voltage supply line;
a switching circuit that is connected gates of the transfer transistors; and
a discharge circuit that is connected the second voltage supply line.

14. The semiconductor memory device according to claim 4,
wherein the delay circuit is connected between the third detecting circuit and the logical circuit.

15. A semiconductor memory device comprising:
a memory cell array that has memory cells each connected to a word line and a bit line;
first detecting means for outputting a first detection signal which shows whether an externally supplied external power supply is equal to or more than a first voltage;
second detecting means for outputting, at a higher speed than the first detecting circuit, a second detection signal which shows whether the external power supply is equal to or more than the first voltage;
switching means for, in a write operation that applies a write voltage to a word line connected to the memory cell, outputting the second detection signal that is output from the second detecting means and for, in an operation other than the write operation, outputting the first detection signal that is output from the first detecting means; and
means for terminating the write operation according to the second detection signal that is output from the switching means.

* * * * *